(12) United States Patent
Oishi

(10) Patent No.: US 7,427,544 B2
(45) Date of Patent: Sep. 23, 2008

(54) SEMICONDUCTOR DEVICE AND METHOD OF MANUFACTURING THE SAME

(75) Inventor: Amane Oishi, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 11/635,761

(22) Filed: Dec. 8, 2006

(65) Prior Publication Data
US 2007/0145522 A1 Jun. 28, 2007

(30) Foreign Application Priority Data
Dec. 21, 2005 (JP) ............................ 2005-368161

(51) Int. Cl.
*H01L 21/336* (2006.01)
*H01L 21/8234* (2006.01)
*H01L 21/8238* (2006.01)
*H01L 21/4763* (2006.01)

(52) U.S. Cl. ................. 438/197; 438/199; 438/233; 438/597; 438/587; 438/750; 438/689; 438/778; 438/758; 257/E21.507; 257/E21.627; 257/288; 257/256; 257/316; 257/368

(58) Field of Classification Search .......... 438/197, 438/199, 233, 587, 597, 689, 750, 778, 758; 257/E21.507, E21.627, 288, 256, 316, 368, 257/506, 510, 758
See application file for complete search history.

(56) References Cited

U.S. PATENT DOCUMENTS 6,313,510 B1 * 11/2001 Kim et al. ................. 257/382
6,545,360 B1 * 4/2003 Ohkubo et al. ............. 257/758
6,656,853 B2 12/2003 Ito
6,977,409 B2 * 12/2005 Shirota et al. .............. 257/316
7,208,797 B2 * 4/2007 Yagishita et al. ........... 257/330
7,242,094 B2 * 7/2007 Matsunaga et al. ......... 257/758
2002/0027246 A1 * 3/2002 Kunikiyo ................... 257/347
2002/0031916 A1 * 3/2002 Ohkubo et al. ............. 438/758
2002/0155664 A1 * 10/2002 Noro ......................... 438/263

FOREIGN PATENT DOCUMENTS

JP 2002-198368 A 7/2002

* cited by examiner

*Primary Examiner*—Scott B. Geyer
*Assistant Examiner*—Mohsen Ahmadi
(74) *Attorney, Agent, or Firm*—Foley & Lardner LLP

(57) ABSTRACT

A semiconductor device includes an element isolation insulating film provided in a semiconductor substrate between first and second element regions, a gate electrode running over the element isolation insulating film, first and second element regions, a first stopper film formed on the gate electrode and first element region to cover the first element region and giving a tensile stress, a second stopper film formed on the gate electrode and second element region to cover the second element region and giving a compressive stress, and a contact connected to the gate electrode on the element isolation insulating film. The first and second stopper films overlap each other at least partially on the element isolation insulating film, and a total thickness of the first and second stopper films on the gate electrode on the element isolation insulating film is smaller than a total thickness outside the gate electrode.

20 Claims, 15 Drawing Sheets

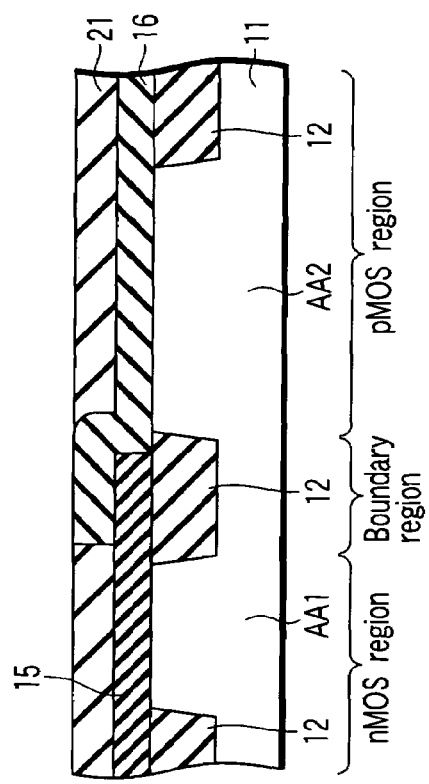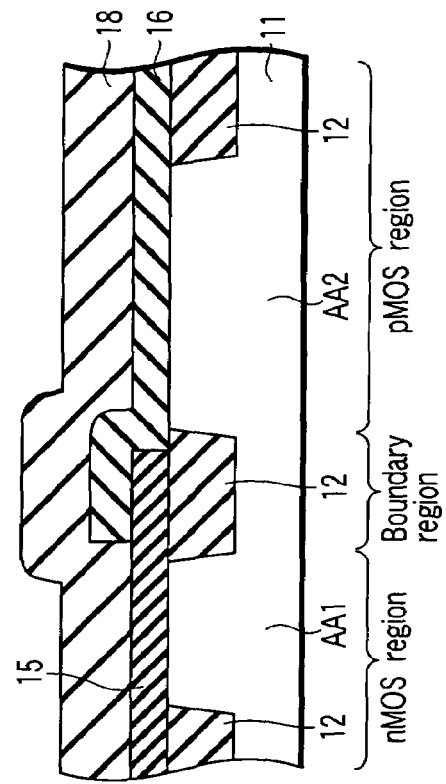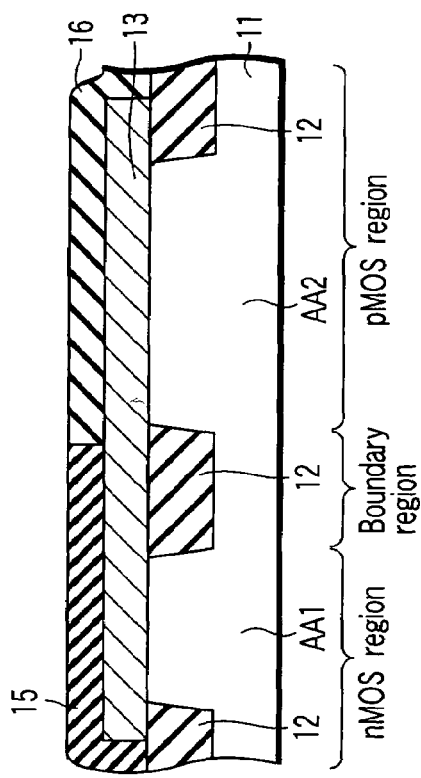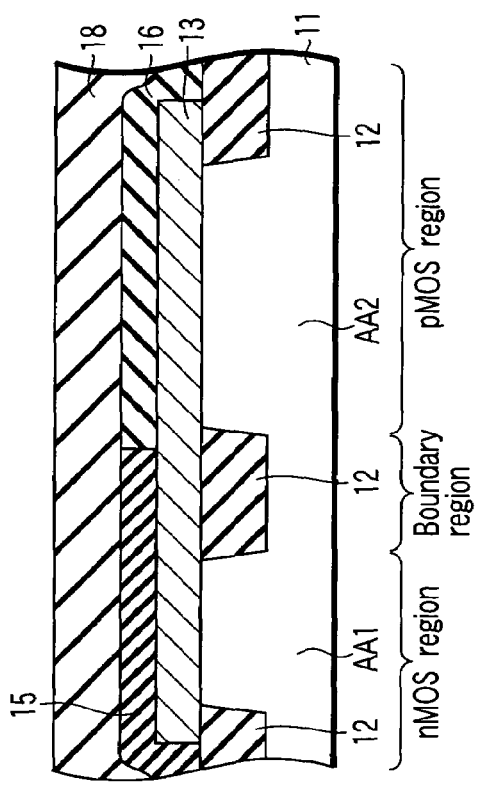
FIG. 7A
FIG. 7B
FIG. 8A
FIG. 8B

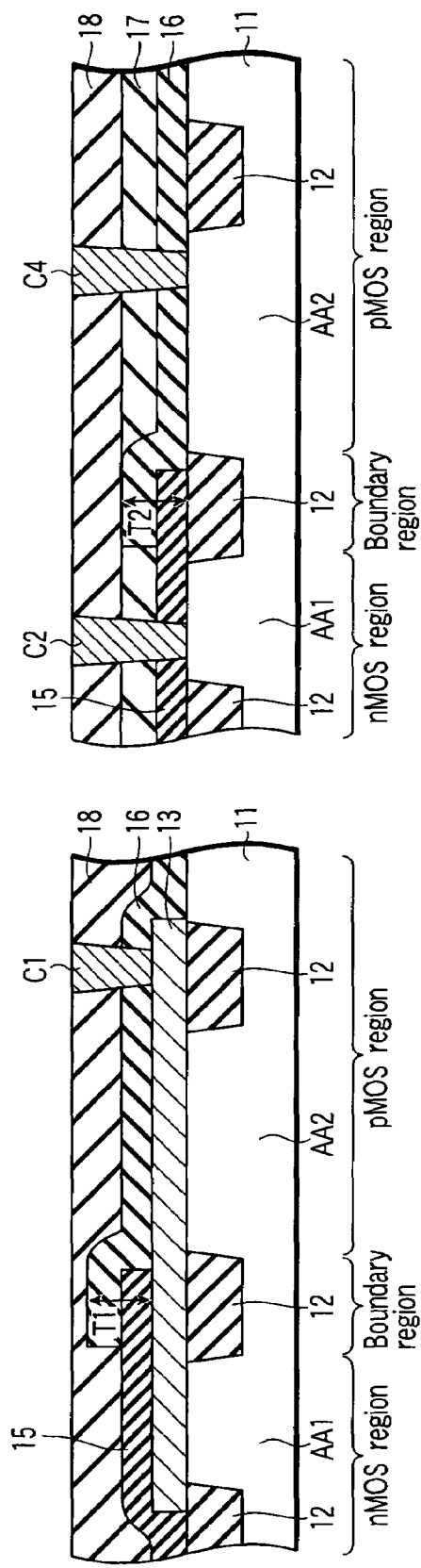
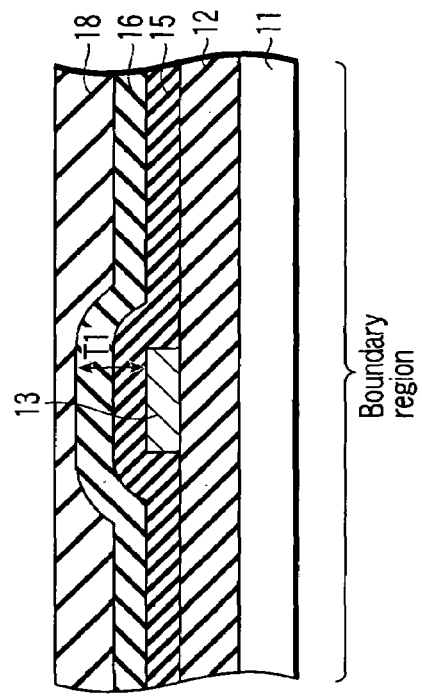
FIG. 15A
FIG. 15B
FIG. 15C

US 7,427,544 B2

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-368161, filed Dec. 21, 2005, the entire contents of which are incorporated herein by reference.

BACKGROUND OF THE INVENTION

1. Field of the Invention

The present invention relates to a semiconductor device having contact etching stopper films with different stresses and a method of manufacturing the same.

2. Description of the Related Art

In the prior art, when a dual stopper film (dual liner film) is introduced, a gap is formed between the stopper film of an nMOSFET and that of a pMOSFET due to misalignment or dimensional variations in lithography for stopper film patterning. As a result, the substantial function of the stopper film which should serve as an etching stopper at the time of contact formation is lost. To prevent this, a stopper film overlap region must be provided at the boundary between the nMOSFET and the pMOSFET. In the process of forming holes in stopper films by contact etching, the necessary etching amount of the stopper film on the gate electrode is about twice that on the element region. To form contacts in both films, overetching is performed to form contacts in the stopper film on the element region. Since a silicide film or shallow trench isolation (STI) structure is largely etched, junction leakage may occur.

Prior art reference information about the present invention is as follows.

[Patent Reference 1] Jpn. Pat. Appln. KOKAI Publication No. 2002-198368

BRIEF SUMMARY OF THE INVENTION

According to a first aspect of the present invention, there is provided a semiconductor device comprising: a semiconductor substrate; a first element region which is provided in the semiconductor substrate; a second element region which is provided in the semiconductor substrate while being spaced part from the first element region; an element isolation insulating film which is provided in the semiconductor substrate between the first element region and the second element region; a gate electrode which runs over the element isolation insulating film, first element region, and second element region; a first stopper film which is formed on the gate electrode and first element region to cover the first element region and give a tensile stress; a second stopper film which is formed on the gate electrode and second element region to cover the second element region and give a compressive stress; and a contact which is connected to the gate electrode on the element isolation insulating film, wherein the first stopper film and second stopper film overlap each other at least partially on the element isolation insulating film, and a total thickness of the first stopper film and second stopper film on the gate electrode on the element isolation insulating film is smaller than a total thickness outside the gate electrode.

According to a second aspect of the present invention, there is provided a semiconductor device comprising: a semiconductor substrate; a first element region which is provided in the semiconductor substrate; a second element region which is provided in the semiconductor substrate while being spaced part from the first element region; an element isolation insulating film which is provided in the semiconductor substrate between the first element region and the second element region; a gate electrode which runs over the element isolation insulating film, first element region, and second element region; a first stopper film which is formed on the gate electrode and first element region to cover the first element region and give a tensile stress; a second stopper film which is formed on the gate electrode and second element region to cover the second element region and give a compressive stress; and a contact which is connected to the gate electrode, wherein the first stopper film and second stopper film overlap each other on the element isolation insulating film, and the contact is connected to the gate electrode in an element isolation region outside the element isolation insulating film, where the first stopper film and second stopper film do not overlap.

According to a third aspect of the present invention, there is provided a semiconductor device manufacturing method comprising: forming an element isolation insulating film in a semiconductor substrate and forming a first element region and second element region which are spaced part by the element isolation insulating film; forming a gate electrode which runs over the element isolation insulating film, the first element region, and the second element region; forming a first stopper film to give a tensile stress on the first element region, forming a second stopper film to give a compressive stress on the second element region, and making the first stopper film and the second stopper film overlap on the element isolation insulating film; making a first total thickness of the first stopper film and second stopper film located on the gate electrode on the element isolation insulating film smaller than a second total thickness of the first stopper film and second stopper film located in a region outside the gate electrode on the element isolation insulating film; and forming a contact which is connected to the gate electrode on the element isolation insulating film.

BRIEF DESCRIPTION OF THE SEVERAL VIEWS OF THE DRAWING

FIGS. 3A and 3B are sectional views showing steps in manufacturing the semiconductor device according to the first embodiment of the present invention, in which FIG. 3A is a sectional view taken along the line IIA-IIA in FIG. 1, and FIG. 3B is a sectional view taken along the line IIB-IIB in FIG. 1;

FIGS. 4A and 4B are sectional views showing steps in manufacturing the semiconductor device according to the first embodiment of the present invention following FIGS. 3A and 3B, in which FIG. 4A is a sectional view taken along the line IIA-IIA in FIG. 1, and FIG. 4B is a sectional view taken along the line IIB-IIB in FIG. 1;

FIGS. 5A and 5B are sectional views showing steps in manufacturing the semiconductor device according to the first embodiment of the present invention following FIGS. 4A and 4B, in which FIG. 5A is a sectional view taken along the line IIA-IIA in FIG. 1, and FIG. 5B is a sectional view taken along the line IIB-IIB in FIG. 1;

FIGS. 6A and 6B are sectional views showing steps in manufacturing a semiconductor device according to the second embodiment of the present invention, in which FIG. 6A is a sectional view taken along the line IIA-IIA in FIG. 1, and FIG. 6B is a sectional view taken along the line IIB-IIB in FIG. 1;

FIGS. 7A and 7B are sectional views showing steps in manufacturing the semiconductor device according to the second embodiment of the present invention following FIGS. 6A and 6B, in which FIG. 7A is a sectional view taken along the line IIA-IIA in FIG. 1, and FIG. 7B is a sectional view taken along the line IIB-IIB in FIG. 1;

FIGS. 8A and 8B are sectional views showing steps in manufacturing the semiconductor device according to the second embodiment of the present invention following FIGS. 7A and 7B, in which FIG. 8A is a sectional view taken along the line IIA-IIA in FIG. 1, and FIG. 8B is a sectional view taken along the line IIB-IIB in FIG. 1;

FIGS. 9A and 9B are sectional views showing steps in manufacturing the semiconductor device according to the second embodiment of the present invention following FIGS. 8A and 8B, in which FIG. 9A is a sectional view taken along the line IIA-IIA in FIG. 1, and FIG. 9B is a sectional view taken along the line IIB-IIB in FIG. 1;

FIGS. 10A and 10B are sectional views showing steps in manufacturing a semiconductor device according to the third embodiment of the present invention, in which FIG. 10A is a sectional view taken along the line IIA-IIA in FIG. 1, and FIG. 10B is a sectional view taken along the line IIB-IIB in FIG. 1;

FIGS. 11A and 11B are sectional views showing steps in manufacturing the semiconductor device according to the third embodiment of the present invention following FIGS. 10A and 10B, in which FIG. 11A is a sectional view taken along the line IIA-IIA in FIG. 1, and FIG. 11B is a sectional view taken along the line IIB-IIB in FIG. 1;

FIGS. 12A and 12B are sectional views showing steps in manufacturing the semiconductor device according to the third embodiment of the present invention following FIGS. 11A and 11B, in which FIG. 12A is a sectional view taken along the line IIA-IIA in FIG. 1, and FIG. 12B is a sectional view taken along the line IIB-IIB in FIG. 1;

FIGS. 13A and 13B are sectional views showing steps in manufacturing the semiconductor device according to the third embodiment of the present invention following FIGS. 12A and 12B, in which FIG. 13A is a sectional view taken along the line IIA-IIA in FIG. 1, and FIG. 13B is a sectional view taken along the line IIB-IIB in FIG. 1;

FIG. 15A is a sectional view taken along a line XVA-XVA in FIG. 14;

FIG. 15B is a sectional view taken along a line XVB-XVB in FIG. 14;

FIG. 15C is a sectional view taken along a line XVC-XVC in FIG. 14;

DETAILED DESCRIPTION OF THE INVENTION

Figure 1:
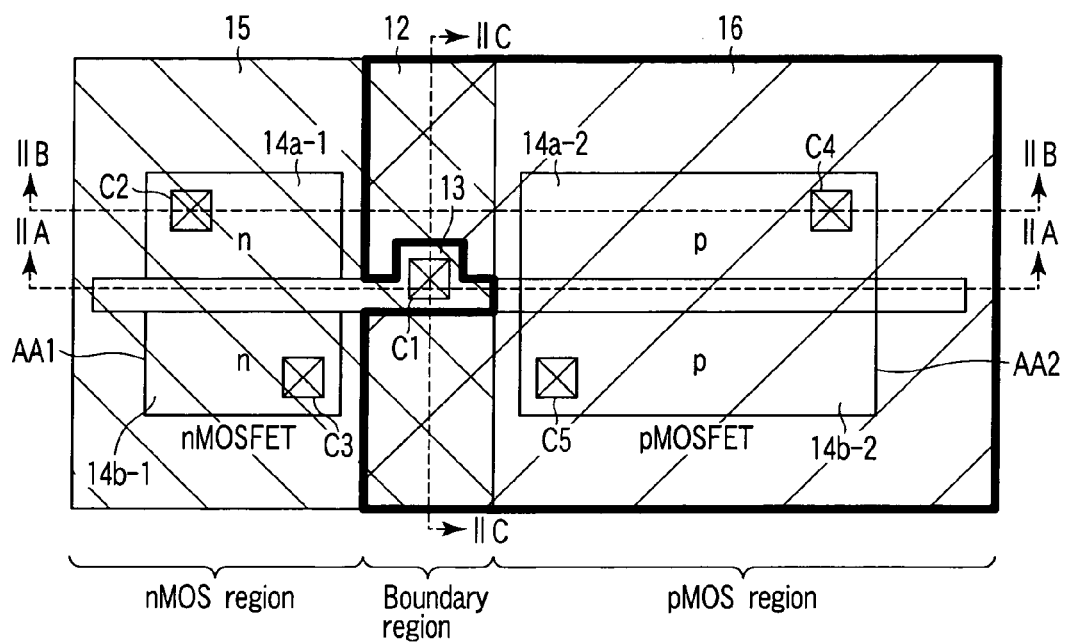
FIG. 1 is a plan view showing a semiconductor device according to the first embodiment of the present invention.

The embodiments of the present invention will be described below with reference to the accompanying drawing. In the description, the same reference numerals denote the same parts throughout the drawing.

First Embodiment

In the first embodiment, contact etching stopper films (to be referred to as stopper films hereinafter) are made to overlap each other in the boundary region between an nMOSFET and a pMOSFET included in a CMOS circuit. Additionally, the stopper film on the gate electrode in the boundary region is formed to be thick so that the etching time of contact formation on the gate electrode equals that on the element region.

Figure 2A:
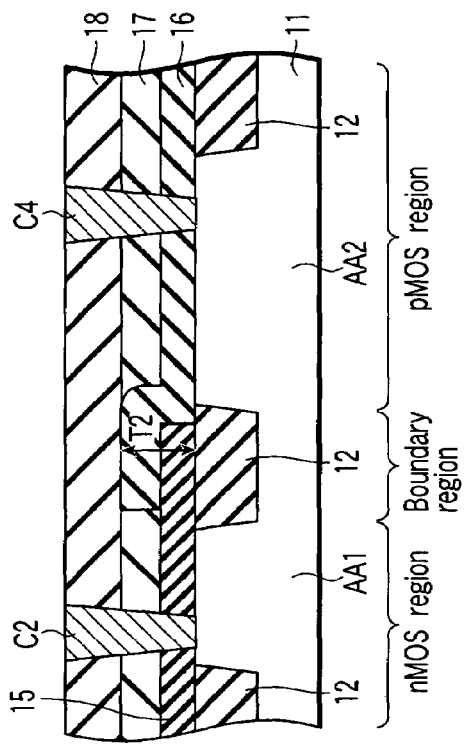
FIG. 2A is a sectional view taken along a line IIA-IIA in FIG. 1.
Figure 2B:
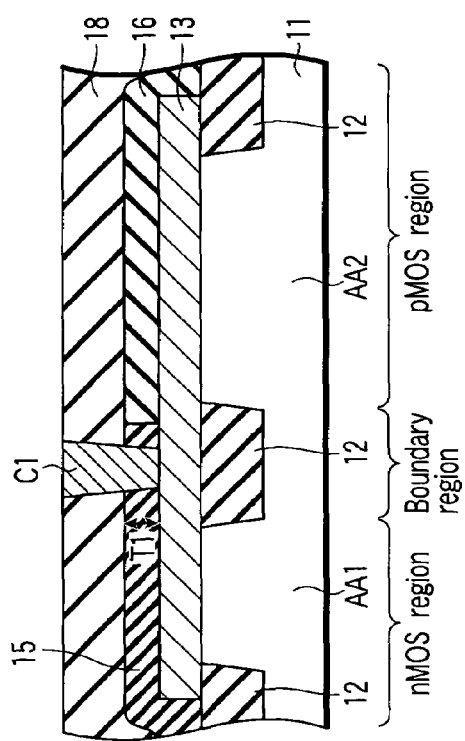
FIG. 2B is a sectional view taken along a line IIB-IIB in FIG. 1.
Figure 2C:
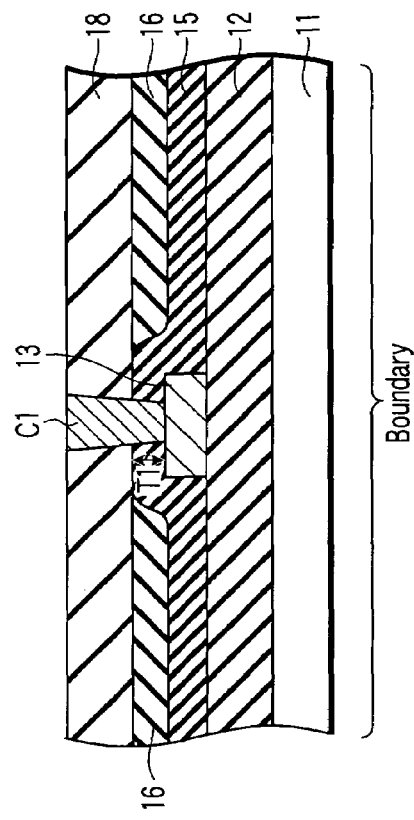
FIG. 2C is a sectional view taken along a line IIC-IIC in FIG. 1.

FIG. 1 is a plan view showing a semiconductor device according to the first embodiment of the present invention. FIGS. 2A to 2C are sectional views taken along lines IIA-IIA, IIB-IIB, and IIC-IIC in FIG. 1, respectively. The semiconductor device according to the first embodiment will be described below.

As shown in FIGS. 1 and 2A to 2C, island-shaped element regions AA1 and AA2 spaced apart from each other are provided in a semiconductor substrate 11. An element isolation insulating film 12 is provided around the element regions AA1 and AA2. A gate electrode 13 runs straight over the element regions AA1 and AA2 and element isolation insulating film 12. The two ends of the gate electrode 13 are arranged outside the element regions AA1 and AA2.

In the element region AA1, n-type source/drain regions 14a-1 and 14b-1 are formed on both sides of the gate electrode 13 to form an nMOSFET. In the element region AA2, p-type source/drain regions 14a-2 and 14b-2 are formed on both sides of the gate electrode 13 to form a pMOSFET. A CMOS circuit is formed by the nMOSFET and pMOSFET which share the gate electrode 13.

An insulating stopper film 15 to give a tensile stress to the channel region is formed in the nMOS region where the nMOSFET is formed. The stopper film 15 covers the element region AA1 and the gate electrode 13 in the nMOS region and extends up to the boundary region. The stopper film 15 to give a tensile stress is made of, e.g., a plasma silicon nitride film or atomic layer deposition (ALD) film.

An insulating stopper film 16 to give a compressive stress to the channel region is formed in the pMOS region where the pMOSFET is formed. The stopper film 16 covers the element region AA2 and the gate electrode 13 in the pMOS region and extends up to the boundary region. The stopper film 16 to give a compressive stress is made of, e.g., a plasma silicon nitride film.

In the boundary region, the stopper films 15 and 16 overlap on the element isolation insulating film 12 but not on the gate electrode 13. For example, of the stopper films 15 and 16, only the stopper film 15 is formed on the gate electrode 13 in the boundary region. Hence, a total thickness (the thickness of only the stopper film 15) T1 of the stopper films 15 and 16 located on the gate electrode 13 in the boundary region is smaller than a total thickness (the total thickness of the stopper films 15 and 16 overlapping on the element isolation insulating film 12 in the boundary region) T2 of the stopper films 15 and 16 located in the region outside the gate electrode 13 in the boundary region.

Since the stopper films 15 and 16 do not overlap on the gate electrode 13, the upper surfaces of the stopper films 15 and 16 are flush with each other on the gate electrode 13. The thickness of the stopper film 15 on the element region AA1 preferably equals that of the stopper film 16 on the element region AA2.

Non-doped silicate glass (NSG) films 17 and 18 are provided on the stopper films 15 and 16. The NSG films 17 and 18 may be, e.g., a boron phosphorous silicate glass (BPSG) film, chemical vapor deposition (CVD) film, or an insulating film based on an oxide film. In consideration of CMP for planarization, the NSG film 17 is preferably made of a material with a relatively low selectivity with respect to the stopper film 16. In consideration of dry etching for contact formation, the NSG films 17 and 18 are preferably made of a material with a high etching selectivity with respect to the stopper films 15 and 16. In this embodiment, the two insulating films on the stopper films 15 and 16 are the NSG films 17 and 18 made of the same material. They may be made of different materials.

In the boundary region, a contact C1 extends through the NSG film 18 and stopper film 15 and connects with the central portion of the gate electrode 13. In the nMOS region, contacts C2 and C3 extend through the NSG films 17 and 18 and stopper film 15 and connect with the source/drain regions 14a-1 and 14b-1, respectively. In the pMOS region, contacts C4 and C5 extend through the NSG films 17 and 18 and stopper film 16 and connect with the source/drain regions 14a-2 and 14b-2, respectively.

Figure 22B:
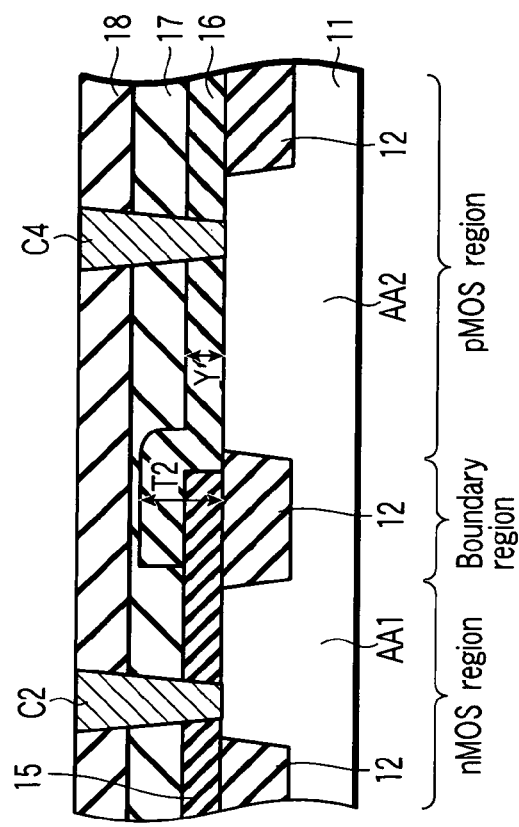
FIG. 22B is a sectional view showing another example taken along the line IIB-IIB in FIG. 1.
Figure 22A:
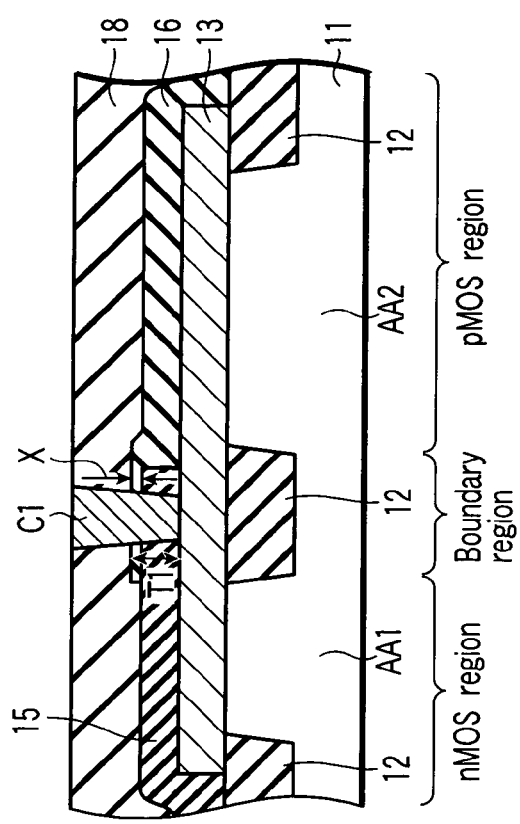
FIG. 22A is a sectional view showing another example taken along the line IIA-IIA in FIG. 1.

As shown in FIGS. 22A and 22B, when the total thickness T1 of the stopper films 15 and 16 located on the gate electrode 13 in the boundary region becomes smaller than the total thickness T2 of the stopper films 15 and 16 overlapping on the element isolation insulating film 12 in the boundary region, the stopper films 15 and 16 may overlap on the gate electrode 13 in the boundary region. In this case, a thickness X of the upper one of the stopper films 15 and 16 overlapping on the gate electrode 13 in the boundary region is preferably about ⅔ or less a thickness Y of the upper one of the stopper films 15 and 16 overlapping on the element isolation insulating film 12 in the boundary region. The reason is as follows. A MOSFET structure of 45-nm generation will be considered. Assume a standard that the salicide film on the element region is not overetched in contact formation. The etching rate in contact formation is assumed to be, e.g., SiN:NiSi=3:1. If etching corresponding to +30% is to be executed to prevent a residue by etching without overetching a 10-nm thick salicide film, the upper limit of the etching amount is 100 nm in SiN (10×(10/3)×3=100). In the 45-nm generation, the thickness of a stopper film is about 60 nm. Hence, the total thickness can be 100 nm when the thickness of the upper layer of the overlap portion is 40 nm or less. If it is assumed that these relationships are maintained independently of the generation, the above-described relationship is derived.

FIGS. 3A and 3B to 5A and 5B are sectional views showing steps in manufacturing the semiconductor device according to the first embodiment of the present invention. The method of manufacturing the semiconductor device according to the first embodiment will be described below.

Figure 3A:
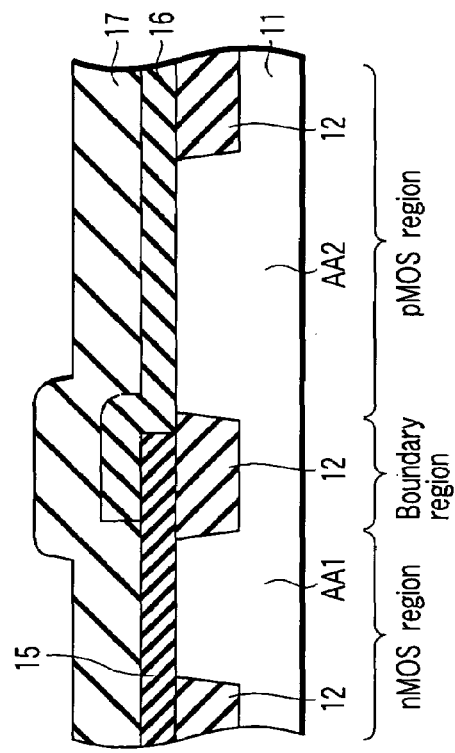
Figure 3B:
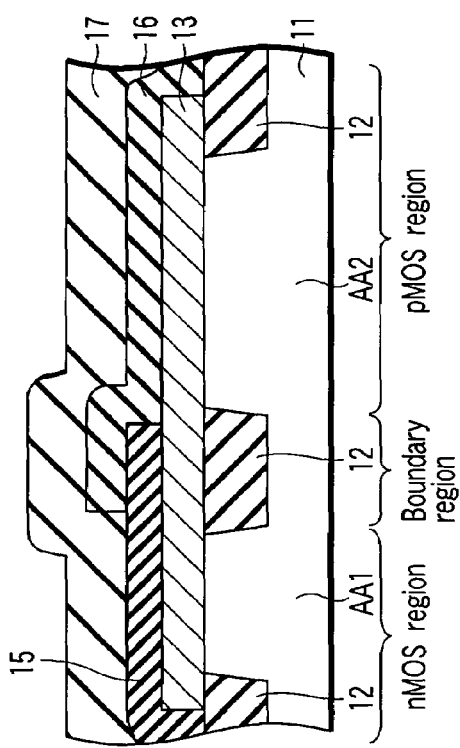

As shown in FIGS. 3A and 3B, the element isolation insulating film 12 with a shallow trench isolation (STI) structure is formed in, e.g., the p-type semiconductor substrate 11 so that the element regions AA1 and AA2 spaced part from each other are formed. An n-well region (not shown) is formed in the element region AA2 of the pMOS region. The gate electrode 13 is formed on a gate insulating film (not shown) on the semiconductor substrate 11 and element isolation insulating film 12. The gate electrode 13 is made of, e.g., polysilicon or a metal. The n-type source/drain regions 14a-1 and 14b-1 are formed in the surface of the element region AA1, and the p-type source/drain regions 14a-2 and 14b-2 are formed in the surface of the element region AA2 by ion implantation. An nMOSFET and pMOSFET are formed in the nMOS region and PMOS region, respectively. A silicide film (not shown) is formed on the source/drain regions 14a-1, 14b-1, 14a-2, and 14b-2.

The stopper film 15 to give a tensile stress is deposited on the gate electrode 13, element regions AA1 and AA2, and element isolation insulating film 12. The stopper film 15 on the PMOS region is removed by lithography. At this time, a patterning boundary is provided on the element isolation insulating film 12 between the nMOS region and the pMOS region. The boundary is set at a point in consideration of process variations in this patterning.

The stopper film 16 to give a compressive stress is deposited on the pMOS region and stopper film 15. The stopper film 16 on the nMOS region is removed by lithography while leaving the stopper film 15 under the stopper film 16. At this time, a patterning boundary is set at a point in consideration of process variations, like the above case. Hence, the stopper films 15 and 16 overlap in the boundary region.

The NSG film 17 is deposited on the stopper films 15 and 16 as a pre-metal dielectrics (PMD). The NSG film 17 is planarized by chemical mechanical polishing (CMP).

Figure 4A:
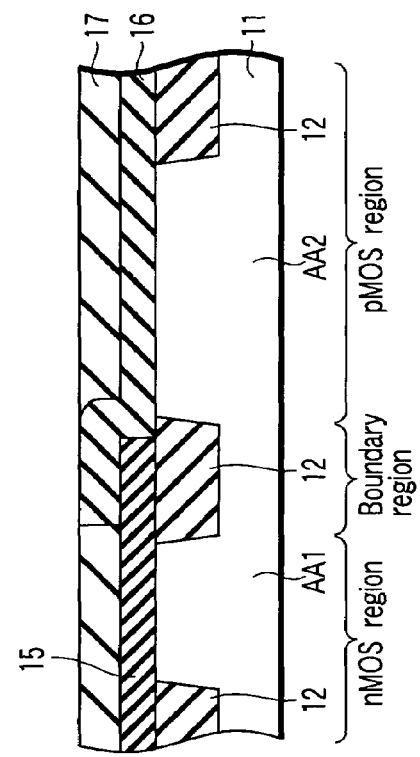
Figure 4B:
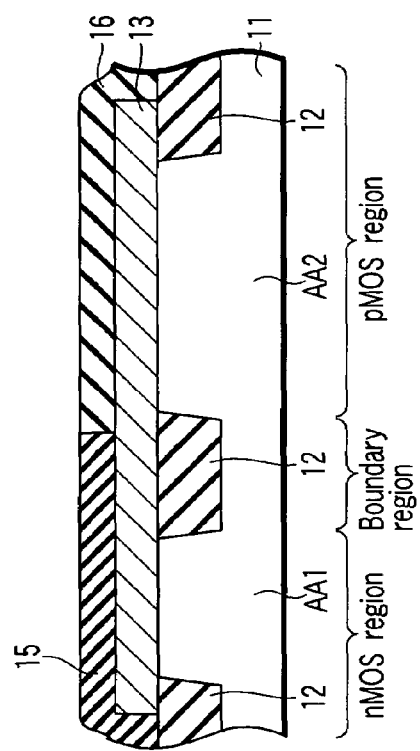

As shown in FIGS. 4A and 4B, the upper stopper film 16 located on the gate electrode 13 on the element isolation insulating film 12 is etched back by CMP so that the lower stopper film 15 is exposed.

Figure 5A:
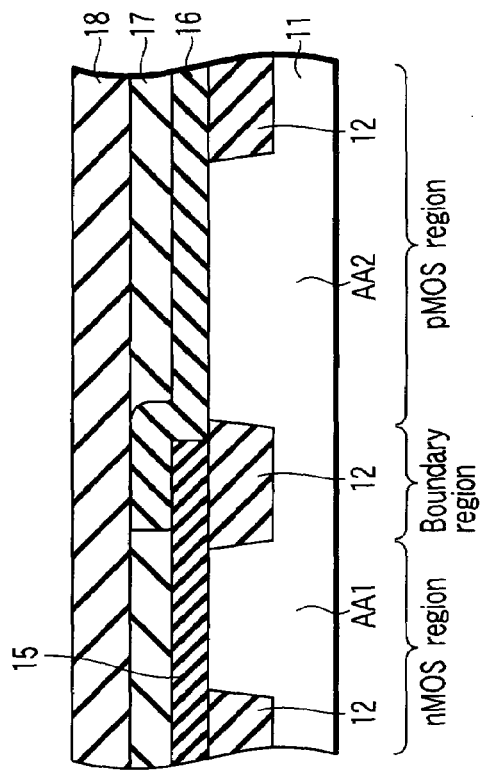
Figure 5B:
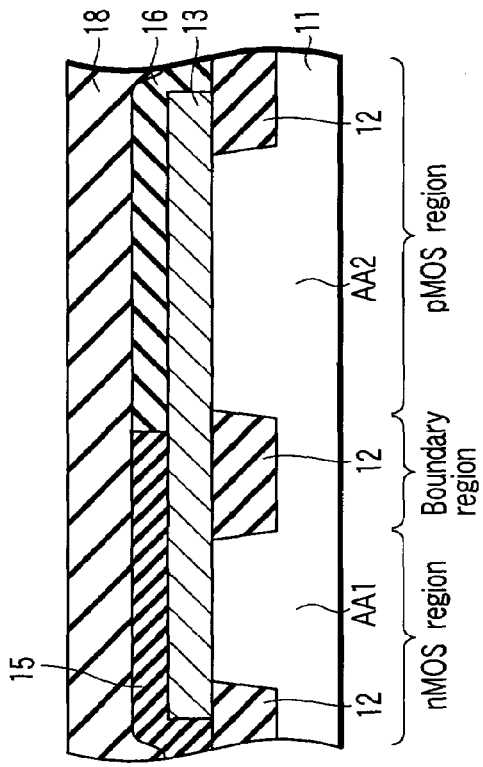

As shown in FIGS. 5A and 5B, the NSG film 18 is deposited again on the stopper films 15 and 16 and NSG film 17. Then, e.g., a tetraethylorthosilicate (TEOS) film (not shown) is deposited.

Next, as shown in FIGS. 2A to 2C, the NSG films 17 and 18 are selectively etched by lithography to form contacts. Etching is stopped by the stopper films 15 and 16. The stopper films 15 and 16 are selectively etched to form contact holes to expose the gate electrode 13 and element regions AA1 and AA2. A metal is buried in the contact holes to form the contacts C1, C2, C3, C4, and C5. After that, a normal interconnection formation process and the like are executed.

According to the first embodiment, the overlap region of the stopper films 15 and 16 is provided in the boundary region between the nMOSFET and the pMOSFET. The stopper film 16 on the gate electrode 13 in the boundary region is removed by etch back. For this reason, only one layer of the stopper film 15 is present on the gate electrode 13 in the boundary region without the overlap portion of the stopper films 15 and 16. Only one layer of the stopper film 15 is present on the element region AA1. Only one layer of the stopper film 16 is present on the element region AA2. Hence, in forming the contacts C1, C2, C3, C4, and C5, the necessary etching amount of the stopper film 15 on the gate electrode 13 almost equals that of the stopper film 15 on the element region AA1 and that of the stopper film 16 on the element region AA2. That is, overetching on the element regions AA1 and AA2 can be suppressed in forming the contact C1 on the gate electrode 13 and the contacts C2, C3, C4, and C5 on the element regions AA1 and AA2. Hence, junction leakage by overetching can be suppressed.

As a high-stress contact liner to improve the mobility of a MOSFET, the stopper film 15 to give a tensile stress to the channel region is provided on the nMOSFET, and the stopper film 16 to give a compressive stress to the channel region is provided on the pMOSFET. Since the stopper films to give the two kinds of stress are combined, the performance of the nMOSFET and that of the pMOSFET can be improved simultaneously.

Second Embodiment

In the second embodiment, the NSG film 17 of the first embodiment is changed to a coat. Parts omitted in the following description are the same as in the first embodiment.

FIGS. 6A and 6B to 9A and 9B are sectional views showing steps in manufacturing a semiconductor device according to the second embodiment of the present invention. The method of manufacturing the semiconductor device according to the second embodiment will be described below.

Figure 6A:
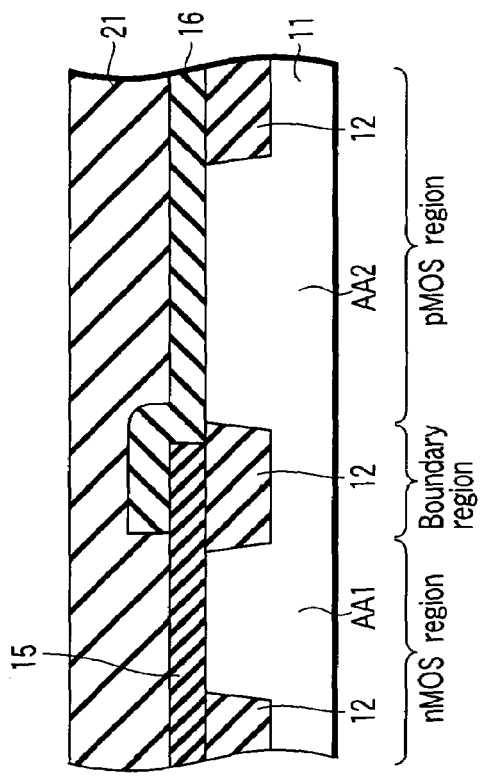
Figure 6B:
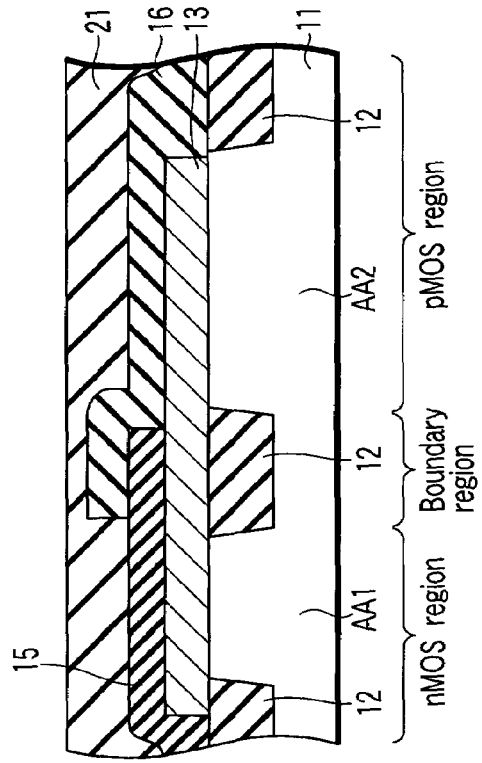

As shown in FIGS. 6A and 6B, a stopper film 15 to give a tensile stress is formed in the nMOS region, and a stopper film 16 to give a compressive stress is deposited in the pMOS region, as in the first embodiment. A coat 21 such as a resist film or spin on glass (SOG) film is formed on the stopper films 15 and 16. Since the coat 21 is buried almost flat, planarization after deposition of an NSG film 17 can be omitted, unlike the first embodiment.

As shown in FIGS. 7A and 7B, the upper stopper film 16 located on a gate electrode 13 on an element isolation insulating film 12 is etched back by CMP so that the lower stopper film 15 is exposed. Then, the coat 21 is wholly peeled by, e.g., isotropic etching. The coat 21 may be left instead of peeling it.

As shown in FIGS. 8A and 8B, an NSG film 18 is deposited on the stopper films 15 and 16. Then, e.g., a TEOS film (not shown) is deposited.

Figure 9A:
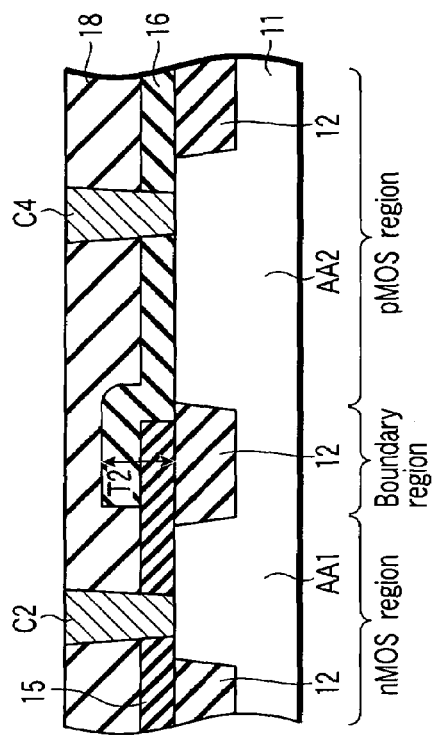
Figure 9B:
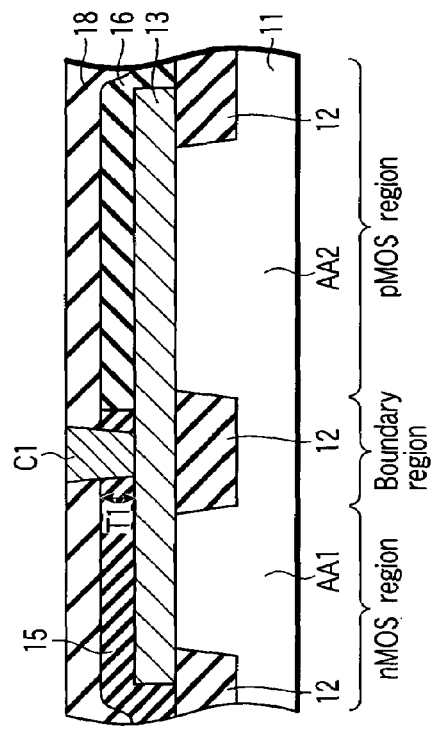

As shown in FIGS. 9A and 9B, the NSG film 18 is selectively etched by lithography to form contacts. Etching is stopped by the stopper films 15 and 16. The stopper films 15 and 16 are selectively etched to form contact holes to expose the gate electrode 13 and element regions AA1 and AA2. A metal is buried in the contact holes to form contacts C1, C2, C3, C4, and C5. After that, a normal interconnection formation process and the like are executed.

According to the second embodiment, not only the same effect as in the first embodiment but also the following effect can be obtained.

The stopper films 15 and 16 formed in the nMOS region and pMOS region overlap each other in the boundary region to form a step. In this embodiment, since the coat 21 with high burying properties is formed on the stopper films 15 and 16, planarization after burying can be omitted.

Third Embodiment

In the third embodiment, planarization of the NSG film 17 and stopper film 16 in the manufacturing method of the first embodiment is executed by two methods: CMP and dry etching. Parts omitted in the following description are the same as in the first embodiment.

FIGS. 10A and 10B to 13A and 13B are sectional views showing steps in manufacturing a semiconductor device according to the third embodiment of the present invention. The method of manufacturing the semiconductor device according to the third embodiment will be described below.

Figure 10A:
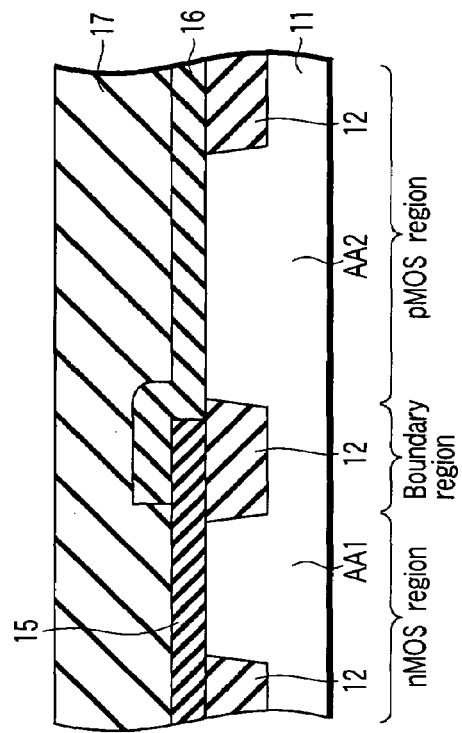
Figure 10B:
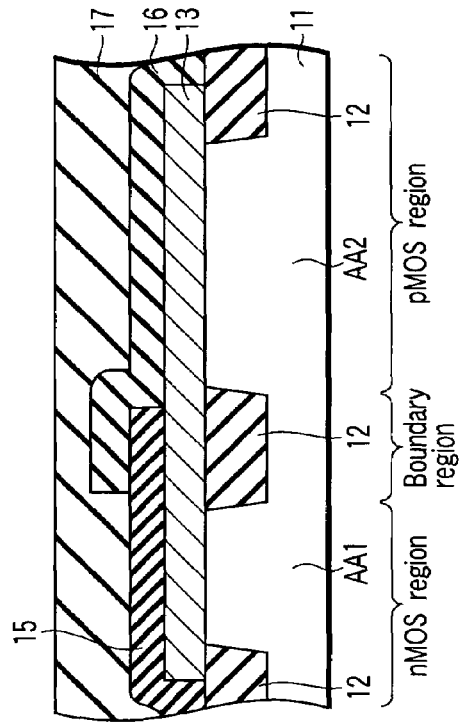

As shown in FIGS. 10A and 10B, a stopper film 15 to give a tensile stress is formed in the nMOS region, and a stopper film 16 to give a compressive stress is deposited in the PMOS region, as in the first embodiment. An NSG film 17 is deposited on the stopper films 15 and 16.

Figure 11A:
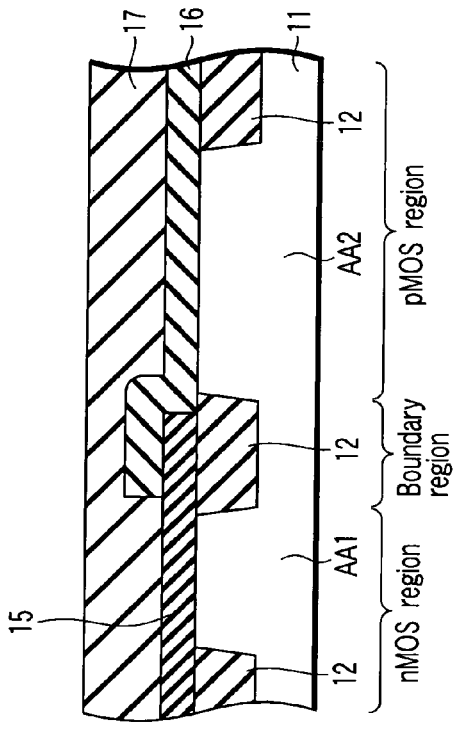
Figure 11B:
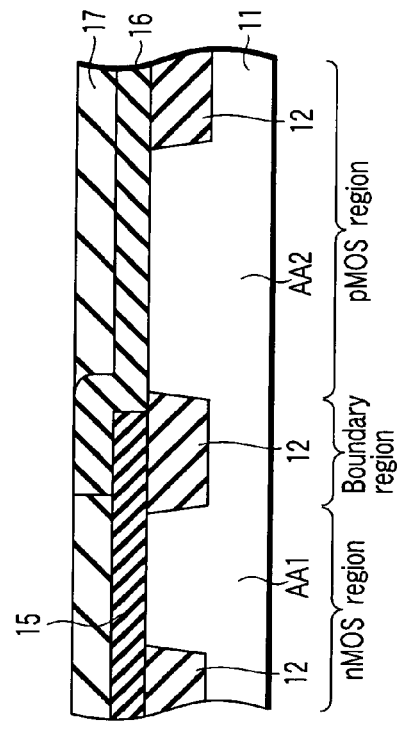

As shown in FIGS. 11A and 11B, the NSG film 17 is planarized by CMP until the upper stopper film 16 on a gate electrode 13 in the boundary region is exposed.

Figure 12A:
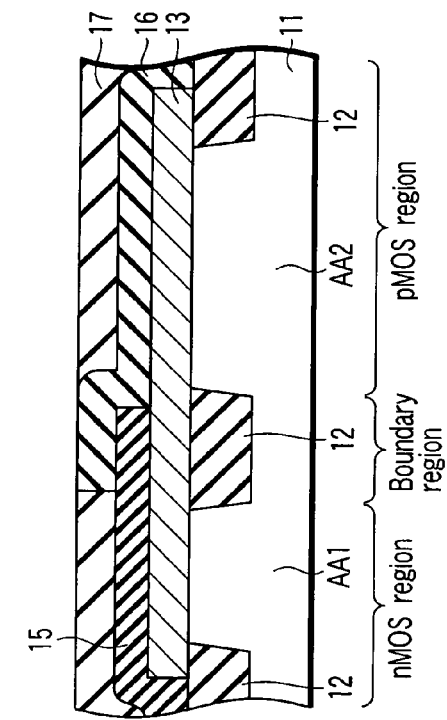
Figure 12B:
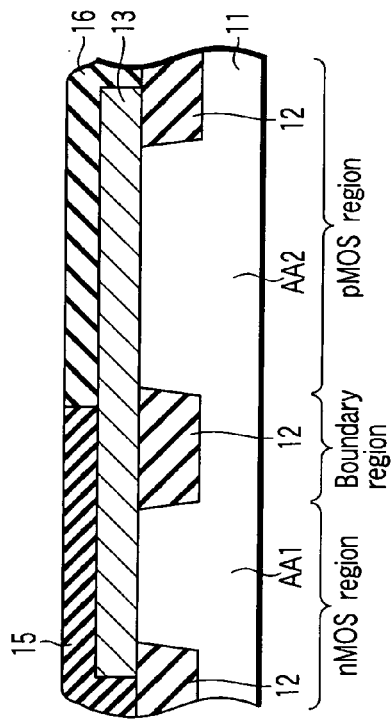

As shown in FIGS. 12A and 12B, the stopper film 16 and NSG film 17 are removed by dry etching until the lower stopper film 15 on the gate electrode 13 in the boundary region is exposed. The dry etching is, e.g., RIE which is executed under a condition without a selectivity between the NSG film 17 and the stopper film 16.

Figure 13B:
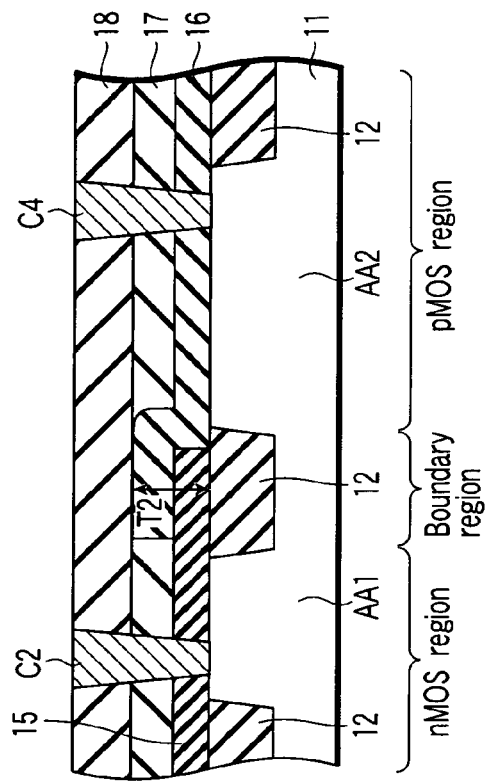
Figure 13A:
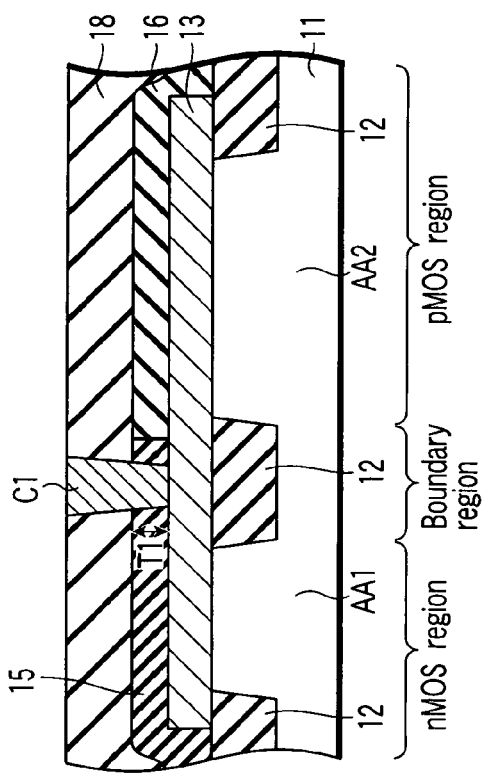
Figure 14:
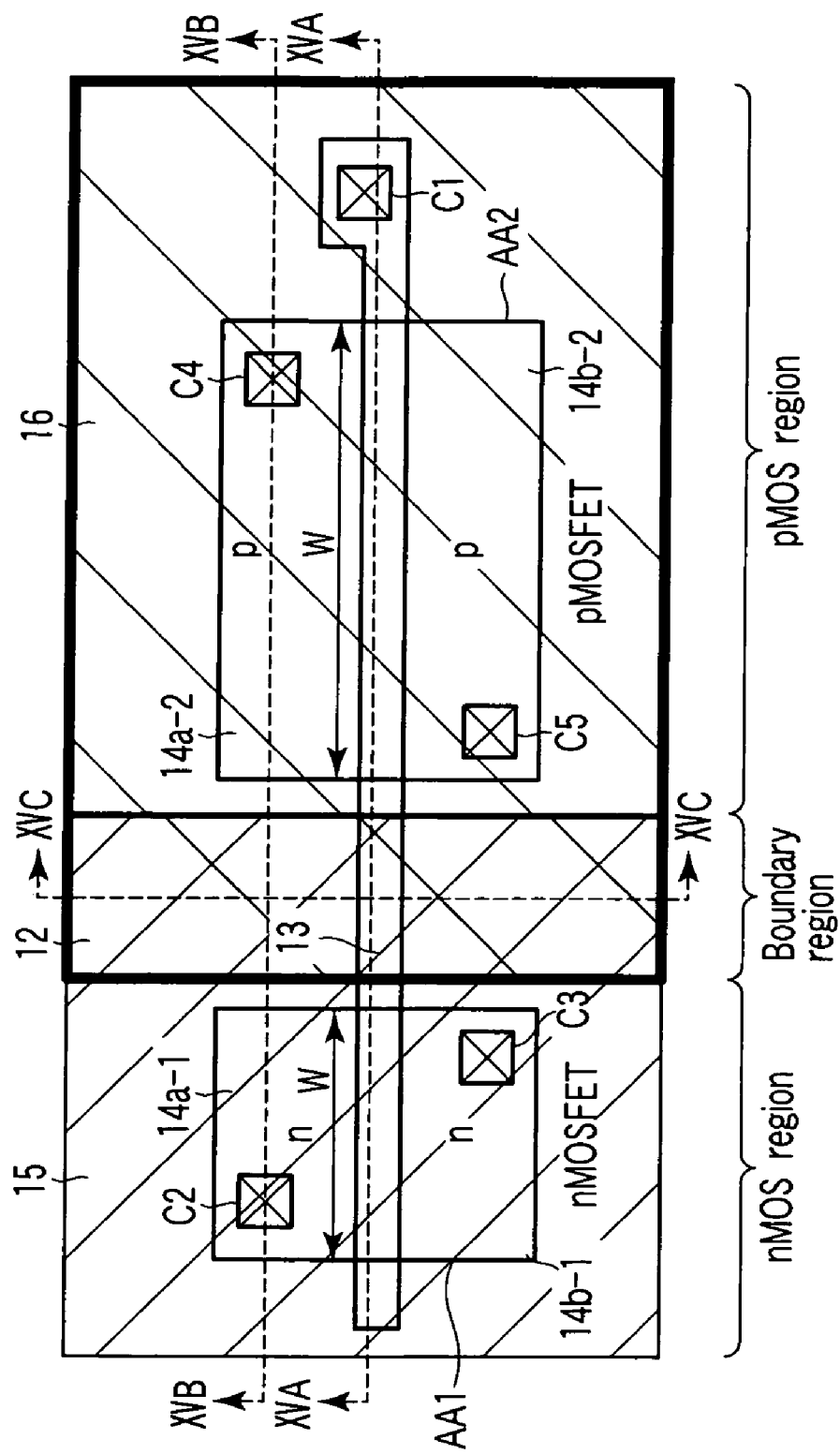
FIG. 14 is a plan view showing a semiconductor device according to the fourth embodiment of the present invention.

As shown in FIGS. 13A and 13B, an NSG film 18 is deposited again on the stopper films 15 and 16 and NSG film 17. Then, e.g., a TEOS film (not shown) is deposited. The NSG films 17 and 18 are selectively etched by lithography to form contacts. Etching is stopped by the stopper films 15 and 16. The stopper films 15 and 16 are selectively etched to form contact holes to expose the gate electrode 13 and element regions AA1 and AA2. A metal is buried in the contact holes to form contacts C1, C2, C3, C4, and C5. After that, a normal interconnection formation process and the like are executed.

According to the third embodiment, not only the same effect as in the first embodiment but also the following effect can be obtained.

In the third embodiment, the NSG film 17 is planarized by CMP (FIGS. 11A and 11B), and then, the stopper film 16 and NSG film 17 are planarized by dry etching (FIGS. 12A and 12B). Hence, the stopper film 16 and NSG film 17, which are made of different materials, can be planarized more easily than in the first embodiment which uses only CMP.

Fourth Embodiment

In the fourth embodiment, a contact C1 connected to the gate electrode is arranged in a region outside the boundary region between the nMOSFET and the pMOSFET, i.e., a region where stopper films 15 and 16 do not overlap.

FIGS. 14, 15A to 15C, 16, and 17 are plan and sectional views of a semiconductor device according to the fourth embodiment of the present invention. The semiconductor device according to the fourth embodiment will be described below. Parts omitted in the following description are the same as in the first embodiment.

As shown in FIGS. 14 and 15A to 15C, in the fourth embodiment, the contact C1 connected to a gate electrode 13 is arranged not in the boundary region between the nMOSFET and the pMOSFET but outside an element region AA2 of the pMOS region. More specifically, the contact C1 connects with the gate electrode 13 at an end of the gate electrode 13 located outside the element region AA2. At the portion where the contact C1 connects with the gate electrode 13, the stopper films 15 and 16 do not overlap, and only the stopper film 16 is present.

The stopper films 15 and 16 overlap on the gate electrode 13 in the boundary region (FIGS. 15A and 15C). A total thickness T1 of the stopper films 15 and 16 located on the gate electrode 13 in the boundary region almost equals a total thickness (the total thickness of the stopper films 15 and 16 overlapping on an element isolation insulating film 12 in the boundary region) T2 of the stopper films 15 and 16 located in the region outside the gate electrode 13 in the boundary region.

According to the fourth embodiment, the contact C1 is arranged not between the nMOSFET and the pMOSFET but outside the element region AA2 of-the pMOSFET. For this reason, the thickness necessary for etching of the contact C1 equals the thickness of the stopper film 16. Since the thickness equals the thickness (the thickness of the stopper film 15 or 16) necessary for etching of contacts C2, C3, C4, and C5, overetching can be prevented. Hence, junction leakage by overetching can be suppressed.

Figure 16:
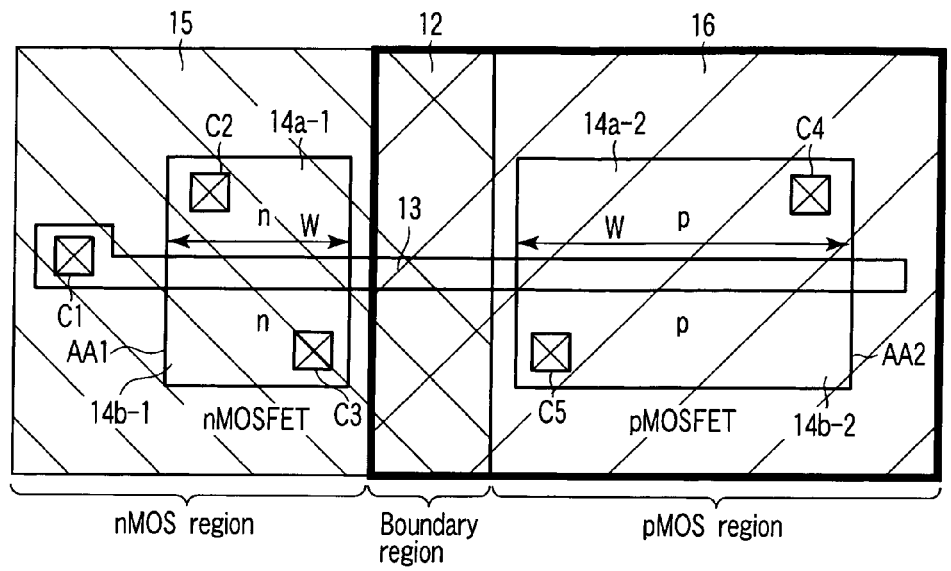
FIGS. 16 and 17 are plan views showing other semiconductor devices according to the fourth embodiment of the present invention.
Figure 17:
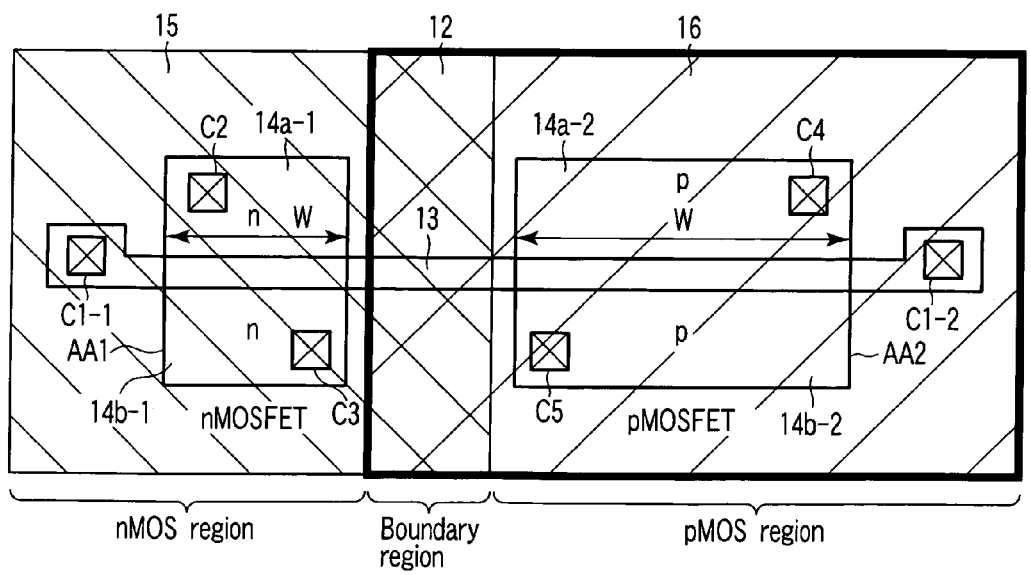
Figure 18:
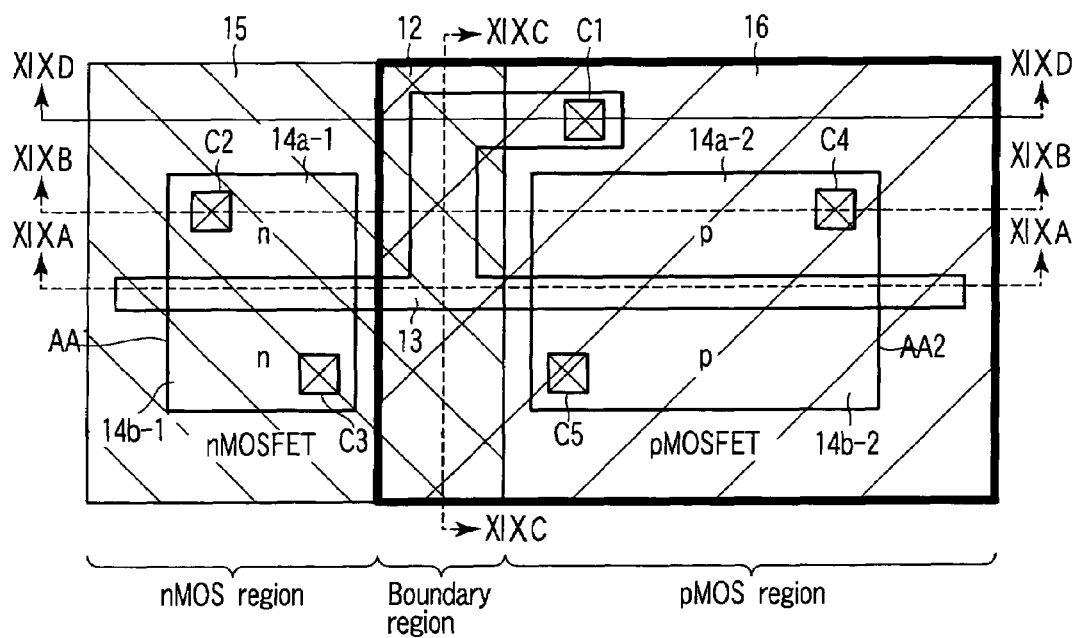
FIG. 18 is a plan view showing a semiconductor device according to the fifth embodiment of the present invention.
Figure 19A:
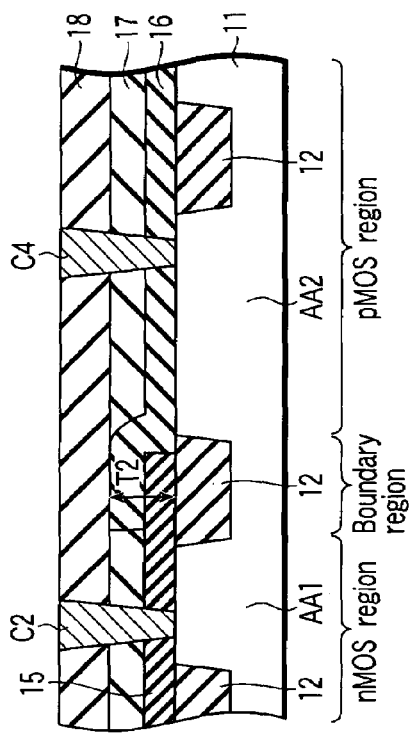
FIG. 19A is a sectional view taken along a line XIXA-XIXA in FIG. 18.
Figure 19C:
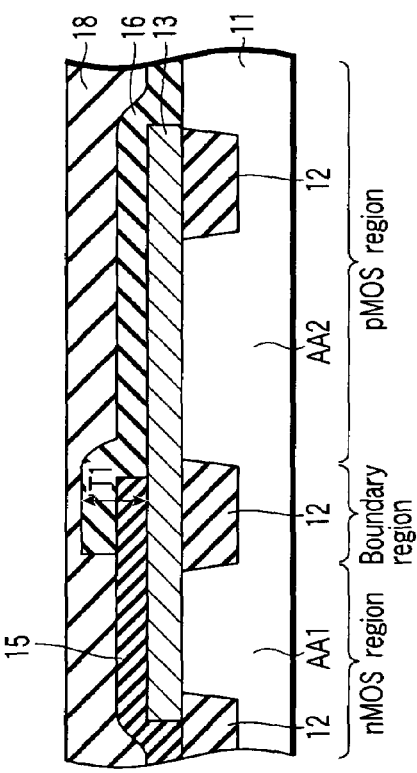
FIG. 19C is a sectional view taken along a line XIXC-XIXC in FIG. 18.
Figure 19B:
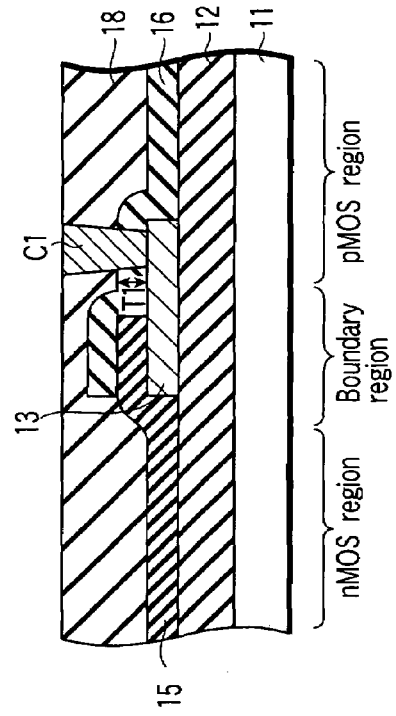
FIG. 19B is a sectional view taken along a line XIXB-XIXB in FIG. 18.
Figure 19D:
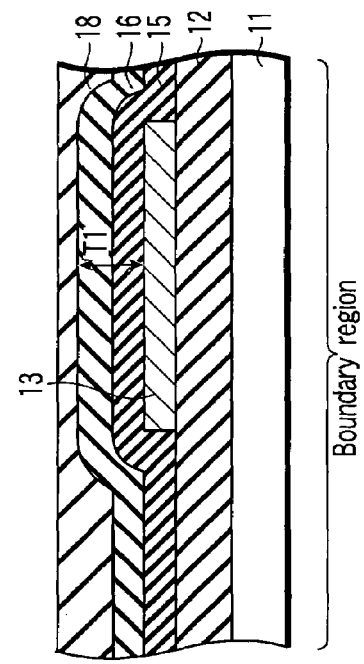
FIG. 19D is a sectional view taken along a line XIXD-XIXD in FIG. 18.

As shown in FIG. 16, the contact C1 may be arranged outside an element region AA1 of the nMOS region. If a gate width W is large, to reduce the influence of IR drop (potential drop on the gate by the gate resistance), contacts C1-1 and C1-2 may be arranged at one end of the gate electrode 13 outside the element region AA1 of the nMOS region and at the other end of the gate electrode 13 outside the element region AA2 of the pMOS region, as shown in FIG. 17.

In the fourth embodiment, even when the total thickness T1 of the stopper films 15 and 16 located on the gate electrode 13 in the boundary region is smaller than the total thickness T2 of the stopper films 15 and 16 located in the region outside the gate electrode 13 in the boundary region, as in the first embodiment, the contact C1 may be arranged in a region outside the boundary region between the nMOSFET and the pMOSFET, i.e., a region where the stopper films 15 and 16 do not overlap.

Fifth Embodiment

In the fifth embodiment, the contact connected to the gate electrode is arranged outside the boundary region between the nMOSFET and the pMOSFET, as in the fourth embodiment. Additionally, in the fifth embodiment, a region for contact is provided by leading the gate electrode from the boundary region.

FIGS. 18, 19A to 19D, and 20 are plan and sectional views of a semiconductor device according to the fifth embodiment of the present invention. The semiconductor device according to the fifth embodiment will be described below. Parts omitted in the following description are the same as in the first embodiment.

As shown in FIGS. 18 and 19A to 19D, in the fifth embodiment, a contact C1 connected to a gate electrode 13 is arranged not in the boundary region between the nMOSFET and the pMOSFET but outside an element region AA2 of the pMOS region. More specifically, the gate electrode 13 is lead from the boundary region to the pMOS region outside the boundary region. The contact Cl connects with the gate electrode 13 at this lead portion. At the lead portion where the contact C1 connects with the gate electrode 13, stopper films 15 and 16 do not overlap, and only the stopper film 16 is present.

The stopper films 15 and 16 overlap on the gate electrode 13 in the boundary region (FIGS. 19A to 19D). A total thickness T1 of the stopper films 15 and 16 located on the gate electrode 13 in the boundary region almost equals a total thickness (the total thickness of the stopper films 15 and 16 overlapping on an element isolation insulating film 12 in the boundary region) T2 of the stopper films 15 and 16 located in the region outside the gate electrode 13 in the boundary region.

According to the fifth embodiment, the same effect as in the fourth embodiment can be obtained. Additionally, in the fifth embodiment, the contact C1 is connected not to an end of the gate electrode 13 but to the lead portion lead from its central portion. Since the distance to an end of each of the nMOSFET and pMOSFET can be shortened, as compared to the structure with the contact C1 being arranged outside, the influence of IR drop can be reduced, and the operation speed can be increased consequently.

Figure 20:
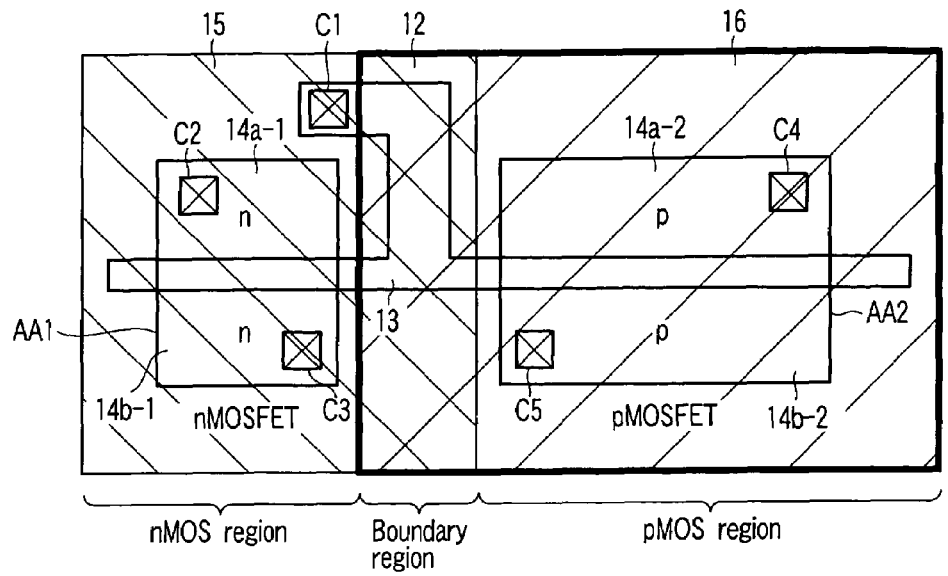
FIG. 20 is a plan view showing another semiconductor device according to the fifth embodiment of the present invention.

As shown in FIG. 20, the contact C1 may be arranged outside an element region AA1 of the nMOS region.

In the fifth embodiment, even when the total thickness T1 of the stopper films 15 and 16 located on the gate electrode 13 in the boundary region is smaller than the total thickness T2 of the stopper films 15 and 16 located in the region outside the gate electrode 13 in the boundary region, as in the first embodiment, the contact C1 may be connected to the gate electrode 13 in a region lead from the inside to outside of the boundary region, i.e., a region where the stopper films 15 and 16 do not overlap.

Sixth Embodiment

In the sixth embodiment, a gate electrode 13 is of multi-finger type.

Figure 21:
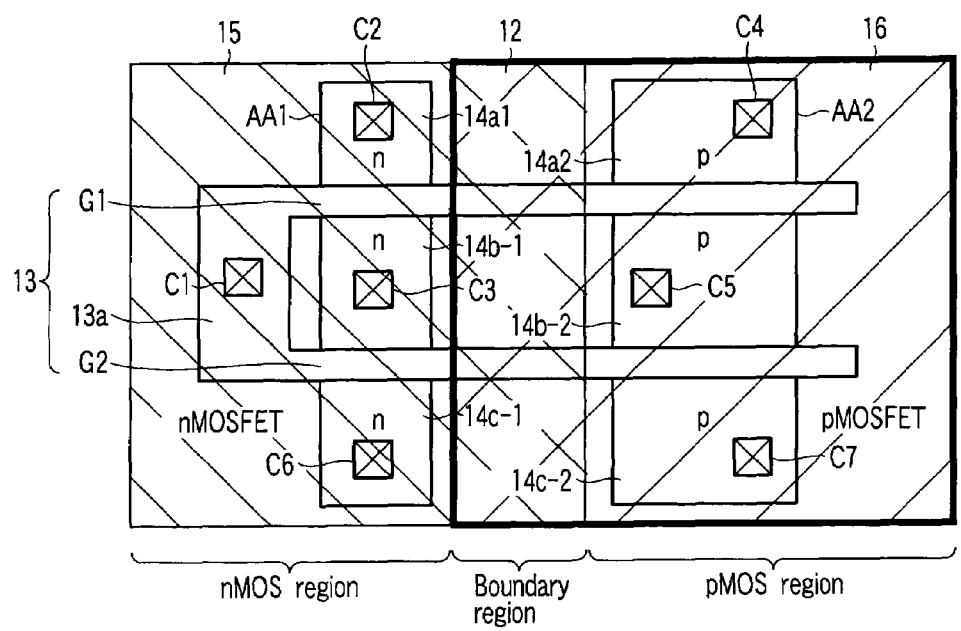
FIG. 21 is a plan view showing a semiconductor device according to the sixth embodiment of the present invention.

FIG. 21 is a plan view showing a semiconductor device according to the sixth embodiment of the present invention. The semiconductor device according to the sixth embodiment will be described below.

As shown in FIG. 21, element regions AA1 and AA2 spaced apart from each other are provided in a semiconductor substrate 11. An element isolation insulating film 12 is provided between the element regions AA1 and AA2. The gate electrode 13 runs over the element regions AA1 and AA2 and element isolation insulating film 12. The gate electrode 13 has gate portions G1 and G2 and a connection portion 13a to connect the gate portions G1 and G2. The gate portions G1 and G2 run straight over the element regions AA1 and AA2 and element isolation insulating film 12 and are spaced part from each other. The gate portions G1 and G2 are connected by the connection portion 13a outside the element region AA1 except the boundary region.

In the element region AA1, n-type source/drain regions 14a-1, 14b-1, and 14c-1 are formed on both sides of the gate portions G1 and G2 to form an nMOSFET. In the element region AA2, p-type source/drain regions 14a-2, 14b-2, and 14c-2 are formed on both sides of the gate portions G1 and G2 to form a pMOSFET. A multi-finger CMOS circuit is formed by the nMOSFET and pMOSFET which share the gate portions G1 and G2.

A stopper film 15 to give a tensile stress to the channel region is formed in the nMOS region where the nMOSFET is formed. The stopper film 15 covers the element region AA1 and the gate electrode 13 in the nMOS region and extends up to the boundary region. The stopper film 15 is made of, e.g., a plasma SiN film or ALD film.

A stopper film 16 to give a compressive stress to the channel region is formed in the pMOS region where the pMOSFET is formed. The stopper film 16 covers the element region AA2 and the gate electrode 13 in the pMOS region and extends up to the boundary region. The stopper film 16 is made of, e.g., a plasma SiN film.

The stopper films 15 and 16 overlap on the gate electrode 13 in the boundary region. A total thickness T1 of the stopper films 15 and 16 overlapping on the gate electrode 13 in the boundary region almost equals a total thickness T2 of the stopper films 15 and 16 overlapping on the element isolation insulating film 12 in the boundary region. As in the first embodiment, the total thickness T1 of the stopper films 15 and 16 located on the gate electrode 13 in the boundary region may be smaller than the total thickness T2 of the stopper films 15 and 16 located on a region outside the gate electrode 13 in the boundary region.

A contact C1 connected to the gate electrode 13 is arranged not in the boundary region between the nMOSFET and the pMOSFET but outside the element region AA1 of the nMOS region. The contact C1 extends through the stopper film 15 and connects with the connection portion 13a of the gate electrode 13. In the nMOS region, contacts C2, C3, and C6 extend through the stopper film 15 and connect with the source/drain regions 14a-1, 14b-1, and 14c-1, respectively. In the pMOS region, contacts C4, C5, and C7 extend through the stopper film 16 and connect with the source/drain regions 14a-2, 14b-2, and 14c-2, respectively.

An NSG film and the like may be provided on the stopper films 15 and 16, as in the first embodiment. The connection portion 13a of the gate electrode 13 may be provided on the PMOS region side.

According to the sixth embodiment, not only the same effect as in the fourth embodiment but also the following effect can be obtained.

To ensure a large current by one MOSFET, a width W is generally increased. If the width is increased in a normal layout, the gate becomes long, and the above-described IR drop occurs. In the sixth embodiment, the gate electrode 13 of multi-finger type is used. Since the length of the gate in the longitudinal direction can be reduced while increasing the effective width W, the influence of IR drop can be reduced.

The present invention is not limited to the above-described embodiments, and various changes and modifications can be made in practicing the present invention. For example, in the above-described embodiments, when the stopper films 15 and 16 overlap in the boundary region, the stopper film 15 to give a tensile stress is the lower layer, and the stopper film 16 to give a compressive stress is the upper layer. However, this order may be reversed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a first element region which is provided in the semiconductor substrate;
a second element region which is provided in the semiconductor substrate while being spaced part from the first element region;
an element isolation insulating film which is provided in the semiconductor substrate between the first element region and the second element region;
a gate electrode which runs over the element isolation insulating film, first element region, and second element region;
a first stopper film which is formed on the gate electrode and first element region to cover the first element region and give a tensile stress;
a second stopper film which is formed on the gate electrode and second element region to cover the second element region and give a compressive stress; and
a contact which is connected to the gate electrode on the element isolation insulating film,
wherein the first stopper film and second stopper film overlap each other at least partially on the element isolation insulating film, and
a total thickness of the first stopper film and second stopper film on the gate electrode on the element isolation insulating film is smaller than a total thickness outside the gate electrode.

2. The device according to claim 1, wherein an upper layer of the first stopper film and second stopper film overlapping on the element isolation insulating film is not present on the gate electrode on the element isolation insulating film.

3. The device according to claim 2, wherein the first stopper film and second stopper film located on the gate electrode have upper surfaces flush with each other.

4. The device according to claim 1, wherein a first thickness of an upper layer of the first stopper film and second stopper film overlapping on the gate electrode on the element isolation insulating film is smaller than a second thickness of the upper layer of the first stopper film and second stopper film overlapping outside the gate electrode on the element isolation insulating film.

5. The device according to claim 4, wherein the first thickness is not more than ⅔ the second thickness.

6. The device according to claim 1, wherein
an n-type transistor is formed in the first element region, and
a p-type transistor is formed in the second element region.

7. The device according to claim 1, wherein
the first stopper film is made of one of a plasma silicon nitride film and an ALD film, and
the second stopper film is made of a plasma silicon nitride film.

8. A semiconductor device comprising:
a semiconductor substrate;
a first element region which is provided in the semiconductor substrate;
a second element region which is provided in the semiconductor substrate while being spaced part from the first element region;
an element isolation insulating film which is provided in the semiconductor substrate between the first element region and the second element region;
a gate electrode which runs over the element isolation insulating film, first element region, and second element region;
a first stopper film which is formed on the gate electrode and first element region to cover the first element region and give a tensile stress;
a second stopper film which is formed on the gate electrode and second element region to cover the second element region and give a compressive stress; and
a contact which is connected to the gate electrode,
wherein the first stopper film and second stopper film overlap each other on the element isolation insulating film, and
the contact is connected to the gate electrode in an element isolation region outside the element isolation insulating film, where the first stopper film and second stopper film do not overlap.

9. The device according to claim 8, wherein a first total thickness of the first stopper film and second stopper film located on the gate electrode on the element isolation insulating film equals a second total thickness of the first stopper film and second stopper film located outside the gate electrode on the element isolation insulating film.

10. The device according to claim 8, wherein a first total thickness of the first stopper film and second stopper film located on the gate electrode on the element isolation insulating film is smaller than a second total thickness of the first stopper film and second stopper film located outside the gate electrode on the element isolation insulating film.

11. The device according to claim 8, wherein
the gate electrode runs straight and has a first end and second end outside the first element region and the second element region, respectively, and
the contact is connected to the gate electrode at least at one of the first end and the second end.

12. The device according to claim 8, wherein
the gate electrode is lead from a region between the first element region and the second element region to the element isolation region outside the first element region and second element region, where the first stopper film and the second stopper film do not overlap, and
the contact is connected to the gate electrode at the lead portion.

13. The device according to claim 8, wherein the gate electrode comprises:
a first gate portion which runs over the element isolation insulating film, the first element region, and the second element region;
a second gate portion which runs over the element isolation insulating film, the first element region, and the second element region while being spaced apart from the first gate portion; and
a connection portion which connects the first gate portion and second gate portion outside the first element region and second element region except a region between the first element region and the second element region, and
the contact is connected to the gate electrode at the connection portion.

14. A semiconductor device manufacturing method comprising:
forming an element isolation insulating film in a semiconductor substrate and forming a first element region and second element region which are spaced part by the element isolation insulating film;
forming a gate electrode which runs over the element isolation insulating film, the first element region, and the second element region;
forming a first stopper film to give a tensile stress on the first element region, forming a second stopper film to give a compressive stress on the second element region, and making the first stopper film and the second stopper film overlap on the element isolation insulating film;
making a first total thickness of the first stopper film and second stopper film located on the gate electrode on the element isolation insulating film smaller than a second total thickness of the first stopper film and second stopper film located in a region outside the gate electrode on the element isolation insulating film; and
forming a contact which is connected to the gate electrode on the element isolation insulating film.

15. The method according to claim 14, further comprising:
forming a first insulating film on the first stopper film and second stopper film after the first stopper film and the second stopper film are made to overlap on the element isolation insulating film;
planarizing the first insulating film;
etching back the first insulating film and an upper stopper film of the first stopper film and second stopper film to make the first total thickness smaller than the second total thickness; and
forming a second insulating film on the first insulating film, the first stopper film, and the second stopper film before formation of the contact.

16. The method according to claim 15, wherein each of the first insulating film and second insulating film comprises one of an NSG film, BPSG film, CVD film, and oxide film.

17. The method according to claim 15, wherein in making the first total thickness smaller than the second total thickness, the upper stopper film of the first stopper film and second stopper film overlapping on the gate electrode on the element isolation insulating film is removed until a lower stopper film is exposed.

18. The method according to claim 15, wherein the first insulating film is planarized until the upper stopper film of the first stopper film and second stopper film located on the gate electrode on the element isolation insulating film is exposed.

19. The method according to claim 14, further comprising:
forming a coat on the first stopper film and second stopper film after the first stopper film and the second stopper film are made to overlap on the element isolation insulating film; and
etching back the coat and an upper stopper film of the first stopper film and second stopper film to make the first total thickness smaller than the second total thickness.

20. The method according to claim 19, wherein the coat comprises one of a resist film and SOG film.

* * * * *